United States Patent
Smythe et al.

(10) Patent No.: US 7,985,617 B2
(45) Date of Patent: Jul. 26, 2011

(54) METHODS UTILIZING MICROWAVE RADIATION DURING FORMATION OF SEMICONDUCTOR CONSTRUCTIONS

(75) Inventors: John Smythe, Boise, ID (US); Bhaskar Srinivasan, Boise, ID (US); Ming Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 12/208,886

(22) Filed: Sep. 11, 2008

(65) Prior Publication Data

US 2010/0062562 A1 Mar. 11, 2010

(51) Int. Cl.
*H01L 21/06* (2006.01)
*H01L 21/336* (2006.01)
*H01L 21/00* (2006.01)

(52) U.S. Cl. ... 438/102; 438/306; 438/795; 257/E21.09; 257/E21.333; 257/E21.409

(58) Field of Classification Search ............... 438/102, 438/795, 306; 257/E21.409, E21.09, E21.333
See application file for complete search history.

(56) References Cited

U.S. PATENT DOCUMENTS

| 4,303,455 | A | 12/1981 | Splinter et al. |
| 6,051,483 | A | 4/2000 | Lee et al. |
| 6,133,076 | A | 10/2000 | Yamazaki et al. |
| 6,528,361 | B1 | 3/2003 | Ahn et al. |
| 2002/0139979 | A1 | 10/2002 | Joo et al. |
| 2003/0186519 | A1 | 10/2003 | Downey et al. |
| 2006/0009018 | A1 | 1/2006 | Ikeda |
| 2006/0228897 | A1* | 10/2006 | Timans .................. 438/758 |
| 2007/0167029 | A1* | 7/2007 | Kowalski et al. .......... 438/769 |
| 2008/0152938 | A1 | 6/2008 | Kelman et al. |

FOREIGN PATENT DOCUMENTS

WO PCTUS2009054475 4/2010

OTHER PUBLICATIONS

K. Thompson, et al., "Electromagnetic Annealing for the 100 n. Technology Node" IEEE Electron Device Letters, vol. 23, No. 3, Mar. 2002, pp. 127-129.

\* cited by examiner

*Primary Examiner* — Alexander G Ghyka
*Assistant Examiner* — Seahvosh J Nikmanesh
(74) *Attorney, Agent, or Firm* — Wells St. John P.S.

(57) ABSTRACT

Some embodiments include methods in which microwave radiation is used to activate dopant and/or increase crystallinity of semiconductor material during formation of a semiconductor construction. In some embodiments, the microwave radiation has a frequency of about 5.8 gigahertz, and a temperature of the semiconductor construction does not exceed about 500° C. during the exposure to the microwave radiation.

28 Claims, 8 Drawing Sheets

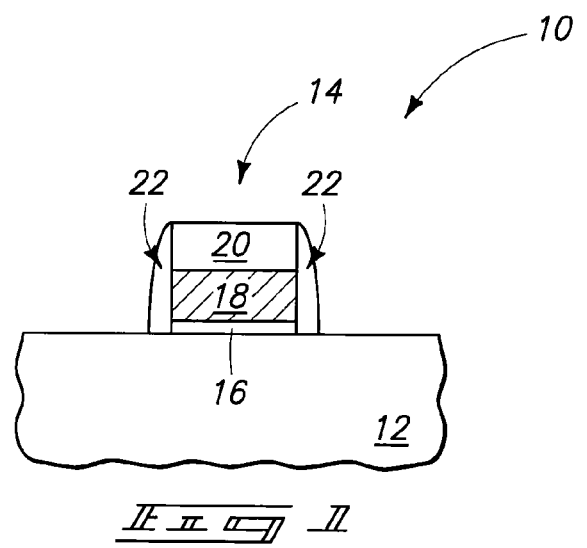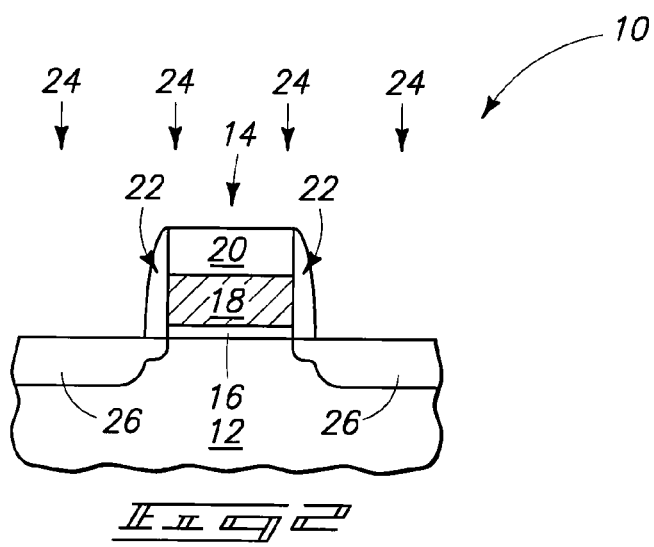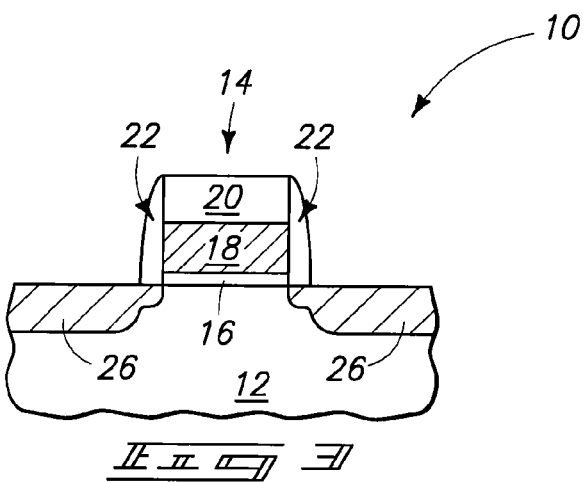

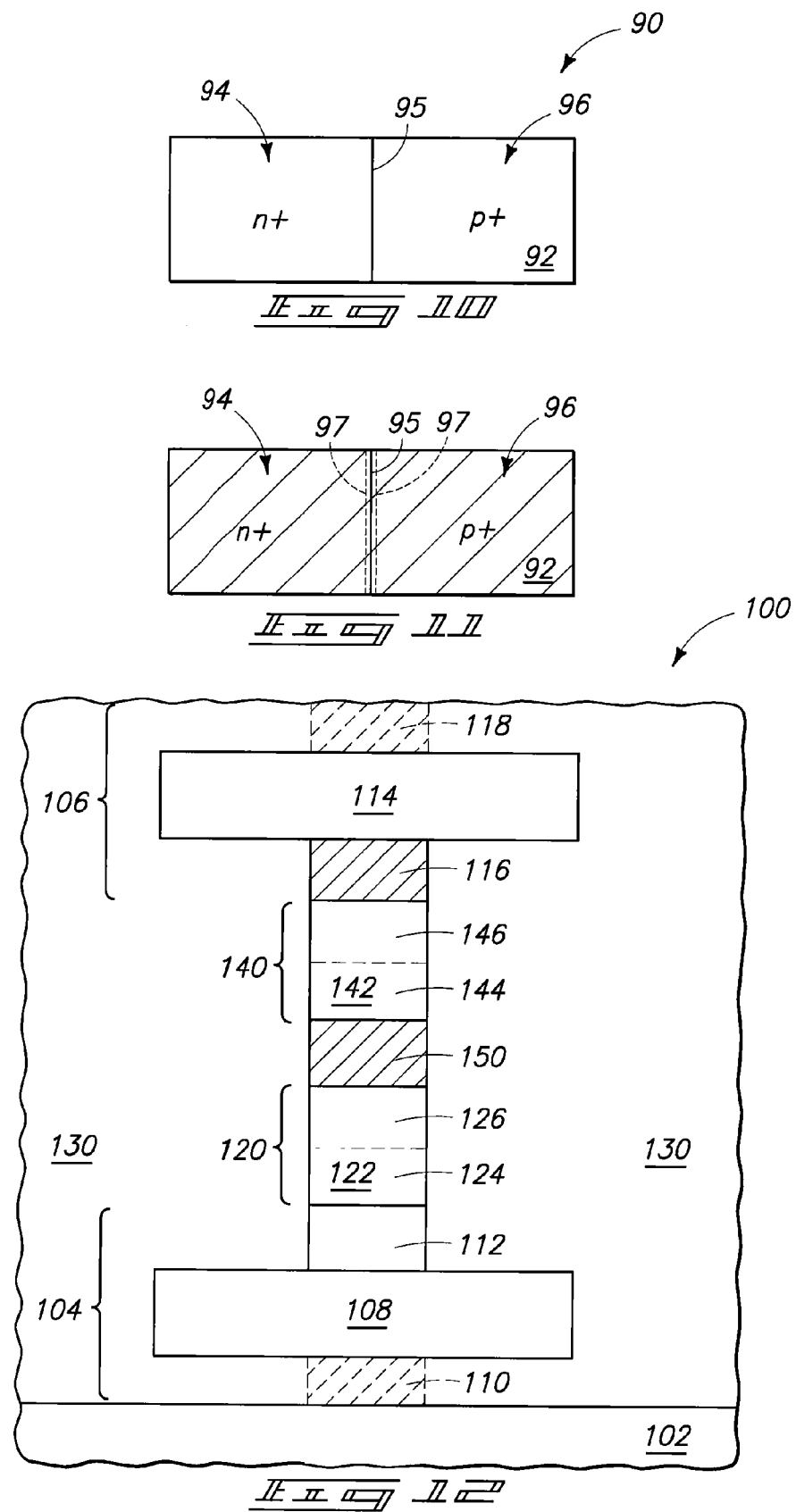

US 7,985,617 B2

METHODS UTILIZING MICROWAVE RADIATION DURING FORMATION OF SEMICONDUCTOR CONSTRUCTIONS

TECHNICAL FIELD

Methods utilizing microwave radiation during formation of semiconductor constructions.

BACKGROUND

Semiconductor device fabrication is utilized to form integrated circuitry (IC), micro-electro-mechanical systems (MEMS), and other micro-structures and assemblies.

The fabrication of an IC may involve implanting dopant into a semiconductor substrate, followed by activation of the dopant.

The implanting may comprise directing energized atoms or molecules of dopant at a semiconductor substrate to drive the dopant to a desired depth within the substrate, and may damage the substrate. For instance, if the dopant is driven into a monocrystalline silicon substrate, some regions of the substrate may become amorphous due to interaction of such regions with the energized atoms or molecules of the dopant.

The amorphous regions are defects, and may disrupt operation of integrated circuit components. Accordingly, it is desired to recrystallize the amorphous regions. Thermal energy has been used to recrystallize amorphous regions. However, many materials utilized in IC are not stable to the thermal energy utilized for recrystallization of silicon. If such materials are present, thermal energy cannot be used for recrystallization of the amorphous silicon without taking a risk of damage to the thermally unstable materials. It is therefore desired to develop new methods for recrystallizing amorphous regions.

Amorphous regions may occur through other mechanisms besides as defects induced during a dopant implant, and may be problematic in other structures besides integrated circuits. For instance, amorphous regions may be problematic in MEMS, and accordingly it would be desired to develop methods that may be applied to diverse applications of semiconductor device fabrication, including, but not limited to MEMs fabrication and IC fabrication.

Some improved methods have been developed for recrystallization of amorphous regions, with such improved methods comprising exposure of a semiconductor construction to radiofrequency radiation or to microwave radiation. However, even the improved methods may lead to undesired heating of semiconductor constructions, and accordingly it would be desired to develop new methods for recrystallization of amorphous regions.

As mentioned above, dopant is activated after it is implanted into a semiconductor substrate. The activation of the dopant comprises transferring the dopant from interstitial positions adjacent a lattice structure of a semiconductor material, into lattice sites of the lattice structure. Dopant activation is traditionally done utilizing thermal energy, but such may lead to the same problems that were described previously as being associated with the utilization of thermal energy for recrystallization of amorphous material. There has been some effort to utilize radiofrequency radiation or microwave radiation for dopant activation, but such may still lead to undesired heating of the semiconductor construction. It is therefore desired to develop methods for activating dopant which avoid undesired heating of semiconductor constructions.

BRIEF DESCRIPTION OF THE DRAWINGS

FIGS. 1-3 are diagrammatic, cross-sectional views of a portion of a semiconductor construction at various process stages of an example embodiment.

FIGS. 10 and 11 are diagrammatic, cross-sectional views of a portion of a semiconductor construction at various process stages of an example embodiment.

FIG. 12 is a diagrammatic, cross-sectional view of a portion of a semiconductor construction at a process stage of an example embodiment.

DETAILED DESCRIPTION OF THE ILLUSTRATED EMBODIMENTS

Figure 4:
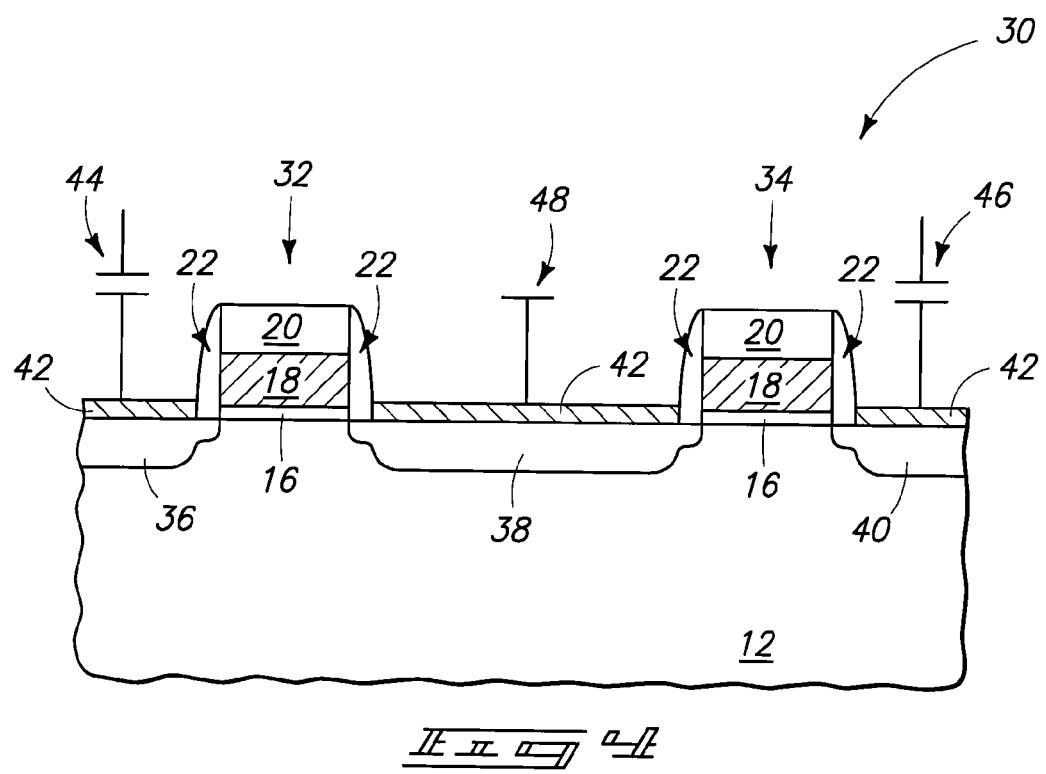
FIGS. 4 and 5 are diagrammatic, cross-sectional views of a portion of a semiconductor construction at various process stages of an example embodiment.

Some embodiments comprise utilization of microwave radiation having a frequency of about 5.8 gigahertz to activate dopant within a semiconductor construction and/or to induce crystallization of semiconductor material. The microwave radiation is referred to as having a frequency of "about" 5.8 gigahertz to indicate that there will generally be some spectrum of radiation having the bulk energy at the frequency of 5.8 gigahertz. The frequency of 5.8 gigahertz corresponds to a wavelength of about 5.2 centimeters, and the radiation may be alternatively referred to as having a main spectrum wavelength peak at about 5.2 centimeters.

Microwave radiation having a frequency of about 5.8 gigahertz couples with silicon of silicon-containing semiconductor constructions, but does not couple with metals, metal-containing compositions, and electrically insulative compositions that may be comprised by the semiconductor constructions. The term "couple" is utilized to indicate that energy is transferred from the microwave radiation to an indicated material, and the term "decouple" is used to indicate that the microwave radiation does not transfer energy to the indicated material.

Microwave radiation having a frequency of about 5.8 gigahertz is found to couple with silicon at low temperatures, and to decouple at higher temperatures. The coupling may only occur at temperatures less than or equal to 500° C., in some embodiments may only occur at temperatures less than or equal to 400° C., and in some embodiments may only occur at temperatures of less than or equal to about 350° C. The temperature at which the silicon transitions from coupling with the microwave radiation to being decoupled from the microwave radiation may be referred to as a decoupling temperature. The temperatures refer to a bulk isothermal state.

If the microwave radiation couples with the silicon, the microwave radiation may induce activation of dopant within such silicon and/or induce crystallization of such silicon. In contrast, the silicon above the decoupling temperature is transparent to the microwave radiation, and accordingly the microwave radiation does not impart energy to silicon that is above the decoupling temperature.

The decoupling may be considered to be thermally-induced decoupling, in that the decoupling is induced by a change in temperature of the silicon material. Such thermally-induced decoupling may be taken advantage of during fabrication of semiconductor constructions to avoid heating of the constructions to temperatures that would cause problems with thermally unstable materials.

For instance, some metal silicides are thermally unstable, and conventional fabrication of semiconductor constructions would not attempt activation of dopant and/or recrystallization of semiconductor material after formation of such metal silicides. This causes difficulty in designing fabrication processes, because there are times when it would be desired to utilize such metal silicides, and yet the metal silicides would be formed prior to the implant of a dopant that would subsequently need to be activated. Generally, such difficulties are addressed by utilizing less desired conductive compositions instead of the desired metal silicide. However, the decoupling mechanism discussed above enables microwave radiation of 5.8 gigahertz to be utilized to activate dopant regardless of whether a thermally-unstable metal silicide is present.

As another example, phase change materials are often thermally unstable, and conventional fabrication of semiconductor constructions would not attempt activation of dopant and/or recrystallization of semiconductor material after formation of phase change materials. This causes difficulty in designing fabrication processes, because there are times when it would be desired to utilize phase change materials, and yet the phase change materials would be formed prior to the implant of a dopant that would subsequently need to be activated. However, the decoupling mechanism discussed above enables microwave radiation of 5.8 gigahertz to be utilized to activate dopant regardless of whether thermally-unstable phase change materials are present.

Other advantages of the utilization of 5.8 gigahertz radiation to activate dopant in silicon is that the activation is self-limiting, and the 5.8 gigahertz radiation induces little or no diffusion of dopant within a silicon matrix. Accordingly, if the 5.8 gigahertz radiation is applied for a duration in excess of the duration needed to fully activate dopant, there will be little or no adverse effect. This is in contrast to thermal activation, which simultaneously causes diffusion of dopant. Thus, if thermal activation is conducted for an excessive duration, there will be excessive diffusion of dopant which can lead to detrimental effects.

Another advantage of the utilization of 5.8 gigahertz radiation is that the effects of the radiation on dopant activation and recrystallization are cumulative if the radiation is applied in multiple doses. Thus, a semiconductor construction may be exposed to a first dose of 5.8 gigahertz radiation to partially activate dopant and/or to partially induce recrystallization in a region of the construction, and then may be later exposed to another dose of the 5.8 gigahertz radiation to complete the activation of the dopant and/or to complete the recrystallization. Multiple doses of microwave radiation may thus work synergistically with one another in some embodiments, as opposed to conventional iso-thermal processes in which later doses of thermal energy may deactivate dopants that had been activated by earlier doses of thermal energy. This advantage of the utilization of microwave radiation to activate dopants may be of particular utility during fabrication of semiconductor constructions having a number of levels stacked over one another.

As discussed in the "Background" of this disclosure, microwave radiation has previously been utilized for both activation of dopant within semiconductor constructions, and for inducing crystallization of semiconductor materials. However, the previous utilizations of microwave radiation did not recognize specific advantages that may be obtained by utilizing microwave radiation having a frequency of about 5.8 gigahertz. The previous utilizations of microwave radiation either utilized radiation having a frequency other than 5.8 gigahertz; or utilized wide ranges of radiation which, while including 5.8 gigahertz radiation, did not recognize the advantage of 5.8 gigahertz radiation and treated it like any other microwave radiation within a particular range. However, 5.8 gigahertz radiation is different than at least some of the other microwave radiation within the prior art ranges due to the thermally-induced decoupling that occurs with 5.8 gigahertz radiation. The temperature that such thermally-induced decoupling occurs is particularly suitable for semiconductor fabrication processes, and such has not been recognized or appreciated by the prior art.

Although 5.8 gigahertz radiation has thermally-induced decoupling characteristics particularly suitable for silicon, in some embodiments is recognized that 5.8 gigahertz radiation may also have thermally-induced decoupling characteristics suitable for utilization with other semiconductor materials besides silicon.

Example embodiments in which 5.8 gigahertz radiation is utilized during fabrication of semiconductor constructions, and/or during formation of electronic systems, are described with reference to FIGS. 1-17.

Referring to FIG. 1, a portion of a semiconductor construction 10 is illustrated. The semiconductor construction includes a substrate 12, and a transistor gate stack 14 formed over the substrate.

Substrate 12 may comprise semiconductor material, and in some embodiments may comprise, consist essentially of, or consist of monocrystalline silicon lightly doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Gate stack 14 comprises gate dielectric material 16, conductive gate material 18, and capping material 20.

The gate dielectric material may comprise any suitable composition or combination of compositions, and may, for example, comprise silicon dioxide.

Conductive material 18 may comprise any suitable composition or combination of compositions, and may, for example, comprise one or more of various metals (for instance, tungsten, titanium, etc.), metal-containing compositions (for instance, metal silicide, metal nitride, etc.), and conductively-doped semiconductor materials (for instance, conductively-doped silicon).

Capping material 20 is electrically insulative, and may comprise any suitable composition or combination of compositions. For instance, capping material 20 may comprise one or more of silicon dioxide, silicon nitride and silicon oxynitride.

A pair of electrically insulative sidewall spacers 22 are along the opposing sidewalls of the transistor gate stack. The sidewall spacers may comprise any suitable composition or combination of compositions, and may, for example, comprise one or more of silicon dioxide, silicon nitride and silicon oxynitride.

Referring to FIG. 2, dopant 24 is implanted into substrate 12 to form a pair of implant regions 26 on opposing sides of the transistor gate stack 14. The dopant 24 may be either n-type or p-type, and accordingly the implant regions 26 may be either n-type doped or p-type doped. In example embodiments, the dopant may be selected from the group consisting of boron, phosphorus and arsenic. Although only one dopant implant is illustrated, in some embodiments there may be multiple implants of multiple types of dopants to form various different implant regions, such as, for example, lightly-doped diffusion regions, halo regions and heavily doped regions.

The implant regions 26 may be considered to be aligned with a transistor gate comprising the gate stack 14, in that the gate stack is effectively utilized as a mask to define locations of the implant regions during the implanting of dopant 24.

The implanting of dopant 24 may create defect regions (not shown) within the implant regions where energy from implanted dopant species interacts with monocrystalline semiconductor material (for instance, monocrystalline silicon) of substrate 12, and converts the monocrystalline material to amorphous material.

The implanted dopant at the processing stage of FIG. 2 is primarily in interstitial positions adjacent to substitutional sites in a lattice structure of the semiconductor material of substrate 12. The dopant needs to be activated to transfer the dopant into lattice sites of the lattice structure before the dopant will achieve a desired effect on the conductivity of the substrate within the implant regions.

Referring to FIG. 3, construction 10 is illustrated after the construction has been exposed to a pulse of microwave radiation having a frequency of about 5.8 gigahertz for a duration suitable to activate the dopant within implant regions 26, and to thereby convert the implant regions to electrically conductive regions (illustrated by the cross-hatching of regions 26 at the processing stage of FIG. 3). The duration of the microwave pulse which is suitable to fully activate the dopant within implant regions 26 may be from about five minutes to about 30 minutes. The pulse of microwave radiation may recrystallize amorphous defect regions within the implant regions at the same time that the dopant is activated. Thus, the pulse of microwave radiation at about 5.8 gigahertz may simultaneously heal damage regions within semiconductor material of substrate 12, and activate dopant.

As discussed previously, one of the advantages of utilizing microwave radiation having a frequency of about 5.8 gigahertz is that the microwave radiation will only couple with the silicon at temperatures which do not exceed about 500° C. (in some embodiments which do not exceed about 400° C., or even which do not exceed about 350° C.). Thus, the temperature of the semiconductor material of substrate 12 will not exceed about 500° C. during the exposure to the 5.8 gigahertz microwave radiation, in some embodiments will not exceed about 400° C., and in some embodiments will not exceed about 350° C.

The sidewall spacers 22, and the materials 16 and 20 of the gate stack 14 will be transparent to the microwave radiation having a frequency of about 5.8 gigahertz. The material 18 of the gate stack will be transparent to the radiation at 5.8 gigahertz, unless material 18 comprises a conductively-doped semiconductor composition.

The substrate 12 and any conductively-doped semiconductor composition of material 18 will not heat to a temperature in excess of 500° C. through interaction with the microwave radiation having a frequency of about 5.8 gigahertz. Thus, the temperature of substrate 12, sidewall spacers 22, and materials 16, 18 and 20 will remain at or below 500° C. (in some embodiments at or below about 400° C., and in some embodiments at or below about 350° C.) during the utilization of the 5.8 gigahertz microwave radiation for activation of dopant and/or recrystallization of amorphous structures.

The low temperatures of the materials of construction 50 during the activation and/or recrystallization may enable thermally-sensitive materials to be incorporated into the construction during the exposure to the 5.8 gigahertz microwave radiation. For instance, some electrically conductive materials that would be suitable for utilization in the conductive gate material 18 are avoided in conventional methods for fabricating transistor gates, due to the thermal instability of such materials under the high-temperature conditions conventionally utilized for activating dopant. Among such electrically conductive materials are some metal silicides. However, the low-temperature activation (specifically, activation temperatures at or below 500° C., at or below 400° C., or even at or below 350° C.) may enable such electrically conductive materials to be utilized in the gate material 18; and thus may enable a broader class of materials to be utilized in forming integrated circuit components than may be utilized with conventional processing. The availability of a broader class materials may enable improved integrated circuit components to be fabricated utilizing methods of the present invention, relative to the integrated circuit components that may be fabricated utilizing conventional methods.

Figure 5:
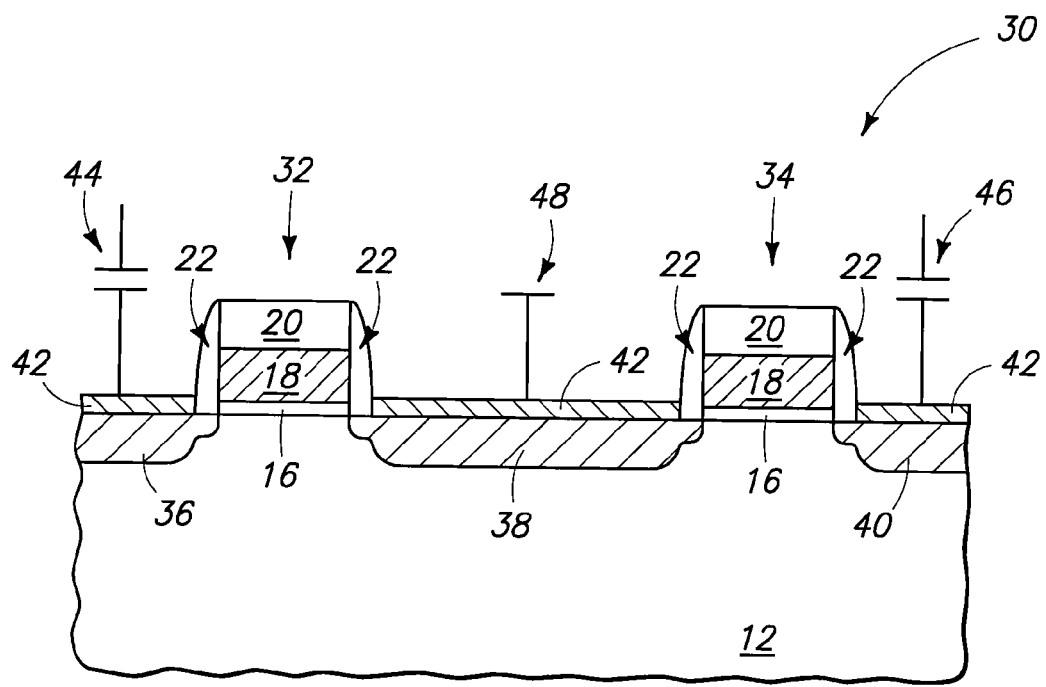

The transistor gate stack 14 and conductively-doped regions 26 are comprised by a field effect transistor. There are numerous applications for field effect transistors, including, for example, utilization in logic and memory of integrated systems. FIGS. 4 and 5 illustrate a method in which field effect transistors are incorporated into dynamic random access memory (DRAM), and in which 5.8 gigahertz microwave radiation may be advantageously utilized during the formation of the DRAM.

Referring to FIG. 4, a portion of a semiconductor construction 30 is illustrated. Similar numbering will be used to describe FIG. 4 as is utilized to describe FIGS. 1-3, where appropriate.

Construction 30 comprises a semiconductor substrate 12, and a pair of transistor gates 32 and 34 over the substrate. The transistor gates comprise the materials 16, 18 and 20 that were discussed above.

Sidewall spacers 22 are along the opposing sidewalls of the transistor gates.

Construction 30 also comprises three implant regions 36, 38 and 40 where dopant has been implanted into substrate 12. The implant regions may be majority doped with either n-type dopant or p-type dopant. A first transistor construction comprises the transistor gate 32, and the implant regions 36 and 38; and a second transistor construction comprises the transistor gate 34, and the implant regions 38 and 40.

Metal silicide (for instance, titanium silicide) 42 is formed over the implant regions, and is utilized to electrically connect the implant regions with electrical circuitry. The metal silicide is utilized to reduce the contact resistance portion of the electrical connection to implanted regions. Such approaches are also used to reduce the external resistance of an associated transistor or device. Capacitors 44 and 46 (schematically illustrated in the diagram of FIG. 4) are electrically connected to implant regions 36 and 40, respectively, through the metal silicide; and a bitline 48 (schematically illustrated in the diagram of FIG. 4) is electrically connected to implant region 38 through the metal silicide.

Referring to FIG. 5, construction 30 is illustrated after microwave radiation having a frequency of about 5.8 gigahertz is utilized to activate dopant within implant regions 36, 38 and 40. The microwave radiation may also be utilized to increase crystallinity of amorphous regions (not shown) within substrate 12.

One of the materials that may be particularly sensitive to thermal temperatures in excess of 500° C. is metal silicide. Accordingly, conventional processing would activate the dopant within implant regions 36, 38 and 40 prior to formation of metal silicide 42. However, the utilization of 5.8 gigahertz microwave radiation enables the activation of the dopant to be conducted after formation of metal silicide 42, without adversely affecting the metal silicide. This can improve versatility of the method utilizing 5.8 gigahertz microwave radiation for dopant activation, relative to conventional methods. For instance, modern semiconductor fabrication often comprises formation of multiple levels of integrated circuitry stacked over one another. It may be desired to activate dopant across several levels simultaneously, in which case one or more of the levels may already have metal silicide at the processing stage in which dopant is activated. Additionally, there may be other applications in which it may be desired to activate dopant in an upper level after metal silicide has already been formed in a lower level.

Metal silicide is one example of a material which is thermally sensitive, and which may create complications in conventional processing due to the high activation energies that are conventionally utilized. It may be the low activation energy associated with transitions of silicides that drive using a low thermal energy process like microwave. In other words, the high thermal energy of bulk annealing may not be compatible with the low activation energy of silicide transition to undesirable state. There are numerous other thermally sensitive materials (some of such materials may be sensitive to spike or flash type anneals, as well as to longer anneals), and the utilization of 5.8 gigahertz microwave radiation for dopant activation may enable such materials to be incorporated into fabrication processes in locations where the materials could not be incorporated utilizing conventional dopant activation methodologies.

FIGS. 6-9 illustrate another application where utilization of 5.8 gigahertz microwave radiation for dopant activation and/or recrystallization of semiconductor material may be advantageous, and specifically illustrate formation of a complementary metal oxide semiconductor (CMOS) construction.

Figure 6:
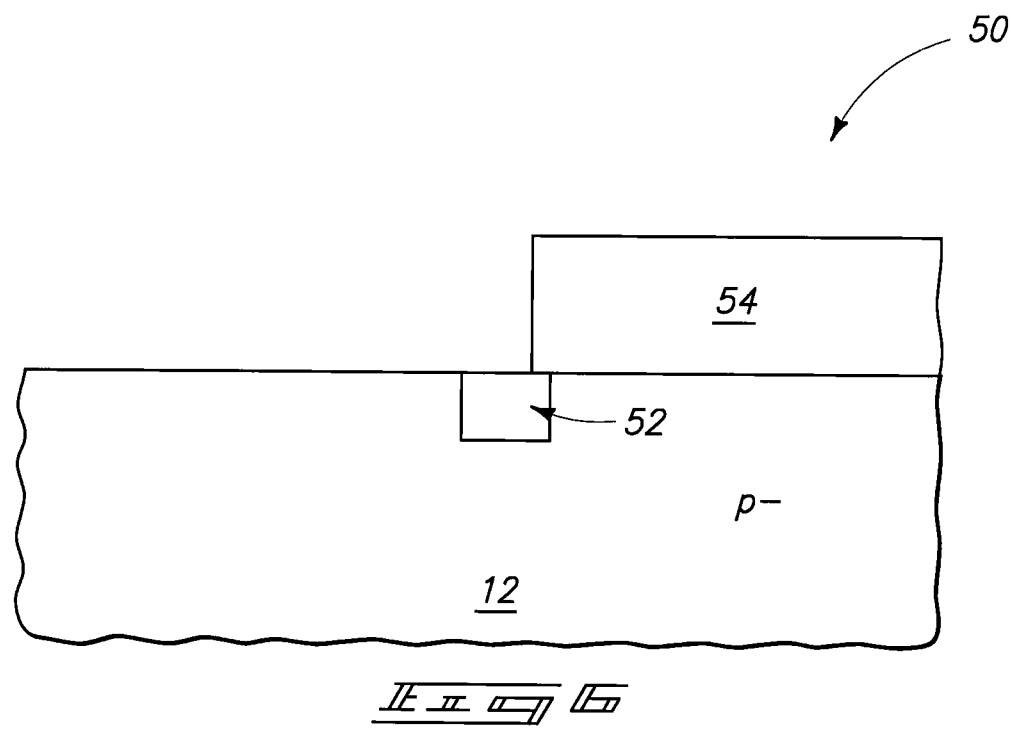
FIGS. 6-9 are diagrammatic, cross-sectional views of a portion of a semiconductor construction at various process stages of an example embodiment.

Referring to FIG. 6, a portion of a semiconductor construction 50 is illustrated. The construction includes a substrate 12 background doped with p-type dopant (shown to be doped to a p-level). The substrate may, for example, comprise, consist essentially of, or consist of lightly doped monocrystalline silicon.

An isolation region 52 extends into substrate 12. The isolation region may comprise, for example, a shallow trench isolation region. Accordingly, the isolation region may comprise a trench formed within substrate 12 and filled with one or more insulative materials; with an example insulative material suitable for utilization in the trenched isolation region being silicon dioxide.

A patterned masking material 54 is over substrate 12. Material 54 may, for example, comprise photolithographically patterned photoresist. The material 54 blocks one portion of the substrate, while leaving another portion exposed.

Figure 7:
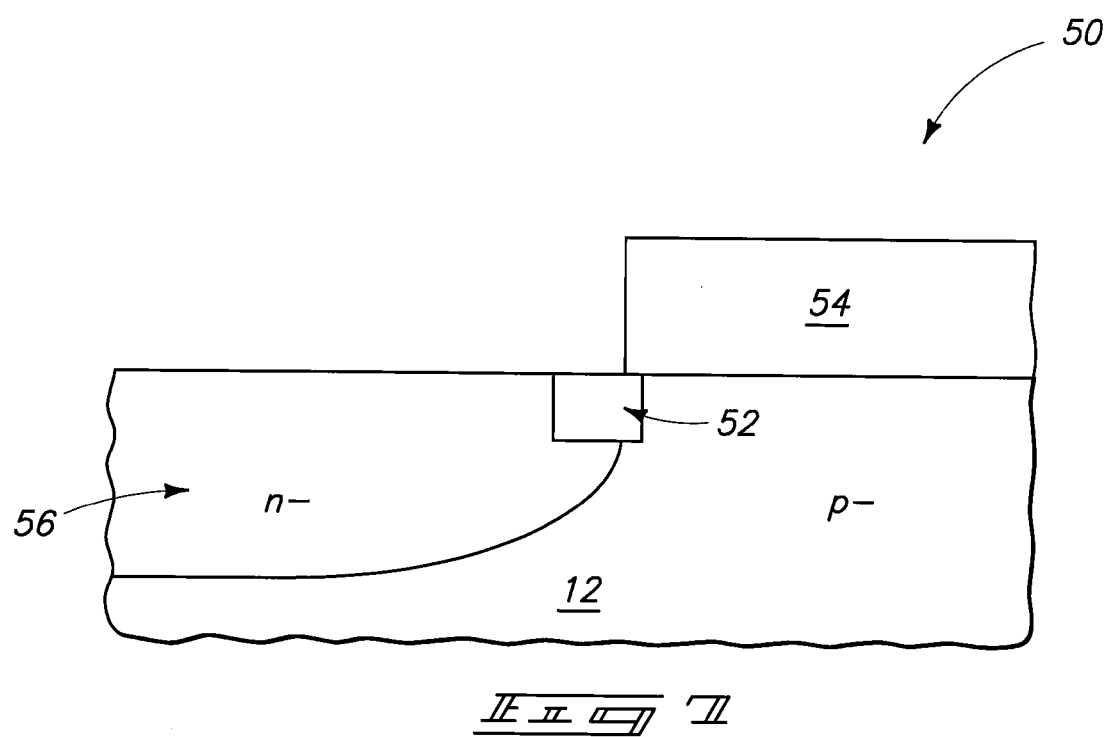

Referring to FIG. 7, n-type dopant is implanted into the exposed portion of substrate 12 to form an n-well 56. The n-well is shown to be doped to an n-level.

Figure 8:
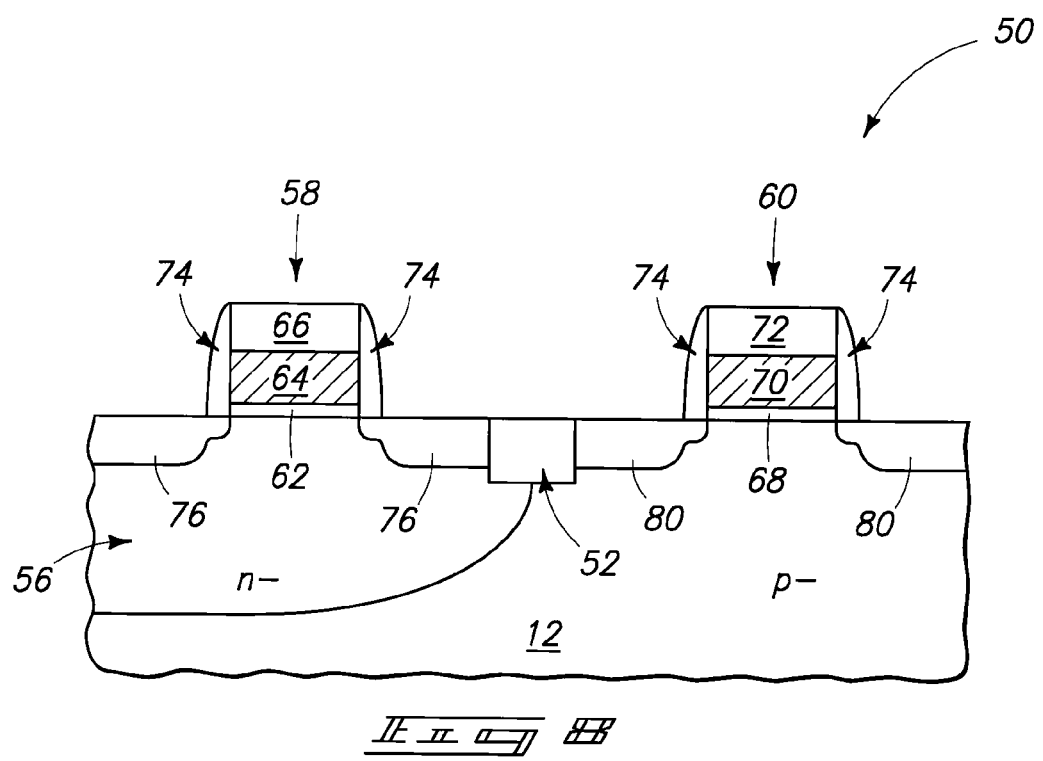

Referring to FIG. 8, masking material 54 (FIG. 7) is removed, and a pair of complementary transistors 58 and 60 are formed over substrate 12. Transistor 58 is a p-channel device, and transistor 60 is an n-channel device.

Transistor 58 includes a transistor gate comprising gate dielectric material 62, conductive gate material 64, and capping material 66. Transistor 58 further includes a pair of sidewall spacers 74, and a pair of implant regions 76.

Transistor 60 includes a transistor gate comprising gate dielectric material 68, conductive gate material 70 and capping material 72. Additionally, transistor 60 includes a pair of sidewall spacers 78, and a pair of implant regions 80.

The implant regions 76 will be majority p-type doped, while the implant regions 80 will be majority n-type doped. In some embodiments, the formation of the n well may be considered to comprise implanting a first dopant having a first conductivity type (with such first dopant having an n-type conductivity type in the shown embodiment); and the formation of the implant regions 76 may be considered to comprise implanting of second dopant having a second conductivity type opposite to the first conductivity type. In the shown embodiment, the implanting of the second dopant forms implant regions entirely contained within the implant region formed by the implanting of the first dopant (in other words, the p-type implant regions 76 are entirely contained within the n-well 56).

Figure 9:
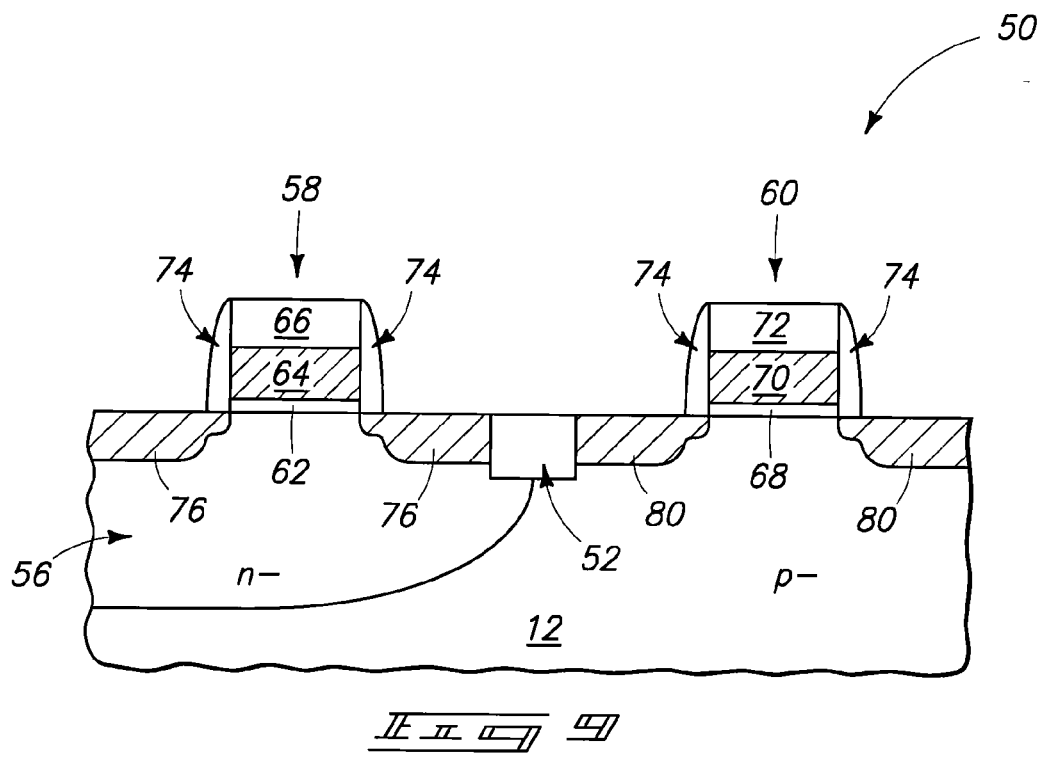

Referring to FIG. 9, the dopants within implant regions 76 and 80 are activated, and accordingly the implant regions become conductively-doped source/drain regions. The activation of the dopants within implant regions 76 and 80 utilizes microwave radiation having a frequency of about 5.8 gigahertz, and may simultaneously repair any changed-crystallinity damage regions that occurred within substrate 12 during formation of the implant regions.

The activation of the dopants within implant regions 76 and 80 may occur simultaneously with activation of the background n-type dopant of the n-well, and the activation of the background p-type dopant within substrate 12 adjacent the n-well. Alternatively, the background n-type and p-type dopants may be at least partially activated prior to activation of the dopants within the implant regions 76 and 80. If the background n-type and p-type dopants are fully activated prior to formation of implant regions 76 and 80, such activation may utilize conventional methods or may utilize 5.8 gigahertz microwave radiation. If the background n-type and p-type dopants are only partially activated prior to formation of implant regions 76 and 80, such partial activation may comprise utilization of 5.8 gigahertz microwave radiation; and the activation of the background n-type and p-type dopants may be completed during the subsequent utilization of 5.8 gigahertz microwave radiation to activate the dopant within the implant regions 76 and 80.

The utilization of 5.8 gigahertz microwave radiation for activation of the dopants within implant regions 76 and 80 may enable thermally-sensitive materials to be utilized in forming the CMOS construction. Also, although the activation of the dopants within implant regions 76 and 80 is shown occurring prior to formation of other materials and structures over the implant regions 76 and 80, in other embodiments (not shown) one or more thermally-sensitive materials (for instance, metal silicide) may be formed over the implant regions prior to the activation of dopant within such implant regions.

The advantages of utilization of 5.8 gigahertz microwave radiation for activation of dopant and/or crystallization of semiconductor materials extend to numerous electrical components besides the transistors discussed above. For instance, semiconductor device fabrication frequently comprises formation of an n-type doped region directly against a p-type doped region to form a diode. If dopants diffuse from the n-type regions and p-type regions across the boundary between the n-type and p-type regions, the interface between the n-type and p-type regions becomes blurred, and the performance of the diode may be adversely affected. An advantage of the utilization of 5.8 gigahertz microwave radiation for dopant activation during fabrication of a diode is that the low-temperature of the dopant activation will substantially reduce thermally-induced diffusion of dopant relative to conventional methods. Thus, there may be little, if any, diffusion of dopant across a p-n interface if 5.8 gigahertz microwave radiation is used for activation of the dopant of a p-n diode.

FIGS. 10 and 11 illustrate an example method of forming a diode. FIG. 10 shows a portion of a semiconductor construction 90. Such construction comprises a semiconductor material 92 (for instance, monocrystalline silicon) having a region 94 heavily doped with n-type dopant (shown doped to an n+ level), and having a region 96 heavily doped with p-type dopant (shown doped to a p+ level). The regions 94 and 96 are shown to be directly against each other, with an interface 95 being illustrated as a line between the regions 94 and 96. Although p+ and n+ levels are illustrated, in some embodiments various combinations of p, p+, p−, n, n+ and n− levels may be utilized (with p− and n− levels being less than or equal to about $10^{18}$ atoms/cm$^3$, and with p+ and n+ levels being greater than or equal to about $10^{22}$ atoms/cm$^3$).

The regions 94 and 96 may be formed by implanting n-type dopant and p-type dopant into material 92. For instance a first mask (not shown) may be utilized to block one of the regions 94 and 96 while dopant is implanted into the other of the regions. The first mask may then be removed and replaced with a second mask (not shown) which blocks whichever of the regions 94 and 96 has received the implant, while dopant is implanted into the other of the regions. The second mask may then be removed to leave the construction of FIG. 10.

Referring to FIG. 11, the n-type dopant of region 94 and the p-type dopant of region 96 are activated by exposure to 5.8 gigahertz microwave radiation, with such activation being diagrammatically illustrated with crosshatching of regions 94 and 96.

The activation has led to modest diffusion of dopant across interface 95, with such diffusion being diagrammatically illustrated by dashed-line boundaries 97. In some embodiments there may be effectively no diffusion across the interface 95. Regardless of whether there is no diffusion, or modest diffusion, the utilization of 5.8 gigahertz microwave radiation may enable a p-n diode to be formed with a much sharper interface between the p-type doped region and the n-type doped region than is formed by conventional methods. Thus, utilization of 5.8 gigahertz microwave radiation for activation of the dopants of a p-n diode may lead to fabrication of a p-n diode having improved performance characteristics relative to p-n diodes formed by conventional methods.

Another advantage of the utilization of 5.8 gigahertz microwave radiation for the activation of dopants of a p-n diode is that such may enable the activation to be conducted after thermally-sensitive materials have been formed proximate the diode. FIG. 12 illustrates a portion of a semiconductor construction 100 in accordance with an example embodiment in which thermally-sensitive materials are formed proximate a p-n diode.

The semiconductor construction 100 includes a semiconductor substrate 102 supporting a pair of memory cells 104 and 106.

Substrate 102 may comprise monocrystalline silicon and one or more materials (not shown) of an integrated circuit construction. Such materials may include electrically conductive materials, electrically insulative materials and/or semiconductive materials.

Memory cell 104 comprises phase change material 108 between a pair of electrically conductive electrodes 110 and 112 (the electrode 110 would be out of the plane of the cross-section of FIG. 12, and thus is shown in dashed-line, or phantom, view). The electrodes may be connected to other circuitry (not shown) which is out of the plane of the cross-section of FIG. 12. The electrodes may comprise any suitable electrically conductive composition, or combination of electrically conductive compositions, and may, for example, comprise, consist essentially of, or consist of conductively-doped semiconductor material, various metals, and/or various metal-containing compositions.

Phase change material 108 may comprise any suitable composition or combination of compositions, and in some embodiments may comprise, consist essentially of, or consist of GST (i.e., a mixture of germanium, antimony and tellurium).

The electrodes 110 and 112 are utilized for altering phase change material 108 during the storage of information in the memory cell 104, as well as for determining the state of phase change material 108 during the reading of information from the memory cell 104.

Memory cell 106 comprises phase change material 114 between a pair of electrically conductive electrodes 116 and 118 (the electrode 118 would be out of the plane of the cross-section of FIG. 12, and thus is shown in dashed-line, or phantom, view). The electrodes may be connected to other circuitry (not shown) which is out of the plane of the cross-section of FIG. 12. The electrodes 116 and 118 may comprise any of the compositions discussed above regarding electrodes 110 and 112.

Phase change material 114 may comprise any suitable composition or combination of compositions, and in some embodiments may comprise, consist essentially of, or consist of GST.

The electrodes 116 and 118 are utilized during the storage of information in the memory cell 106, and during the reading of information from the memory cell, analogously to the utilization of electrodes 110 and 112 in the reading and writing relative to memory cell 104.

The phase change materials 108 and 114 may be referred to as first and second phase change materials in some embodiments.

A pair of diodes 120 and 140 are provided between the memory cells 104 and 106. The diode 120 comprises a semiconductor material 122, and the diode 140 comprises a semiconductor material 142. A bitline 150 is between the diodes 120 and 140. The bitline 150 is a common bitline relative to memory cells 104 and 106.

The construction 100 may be formed by forming semiconductor material 122 over electrode 112 of memory cell 104, forming the bitline 150 over semiconductor material 122, forming semiconductor material 142 over the bitline, and then forming the electrode 116 of memory cell 106 over the semiconductor material 142.

Semiconductor materials 122 and 142 may comprise any suitable composition or combination of compositions, and may be the same composition as one another or may differ from one another in composition. In some embodiments, semiconductor materials 122 and 142 may comprise, consist essentially of, or consist of monocrystalline silicon.

The semiconductor material 122 comprises a doped region 124, and another doped region 126 directly against the doped region 124; and the semiconductor material 142 comprises a doped region 144, and another doped region 146 directly against the doped region 144.

One of the doped regions 122 and 124 may be referred to as a first doped region, and is majority p-type doped; and the other of the doped regions may be referred to as a second doped region, and is majority n-type doped. In subsequent processing, the doped regions 124 and 126 may be exposed to microwave radiation having a frequency of about 5.8 gigahertz to activate dopant within such doped regions (analogously to the activation discussed above with reference to FIGS. 10 and 11). Analogously, one of the doped regions 142 and 144 may be referred to as a first doped region, and is majority p-type doped; and the other of the doped regions may be referred to as a second doped region, and is majority n-type doped. In subsequent processing, the doped regions 144 and 146 may be exposed to microwave radiation having a frequency of about 5.8 gigahertz to activate dopant within such doped regions.

The phase change materials 108 and 114 may be considered to be formed proximate semiconductor materials 122 and 142. The utilization of the 5.8 gigahertz microwave radiation advantageously occurs with low thermal impact on the nearby phase change materials (specifically, is at a temperature at or below 500° C., at or below 400° C., or even at or below 350° C.), and accordingly may be conducted without detriment to the phase change materials. In contrast, it is difficult to form a p-n diode proximate phase change materials utilizing conventional processing because the phase change materials tend to be highly thermally sensitive. Accordingly, the thermal impact of conventional dopant activation methods tend to detrimentally affect the phase change materials.

The construction 100 comprises semiconductor materials 122 and 142 formed after the first phase change material 108, and prior to the second phase change material 114. Accordingly, the activation of dopant within regions 124, 126, 144 and 146 will occur after formation of the first phase change material 108, but may occur before or after formation of the second phase change material 114.

Construction 100 is shown comprising electrically insulative material 130 along the memory cells 104 and 106, along the bitline 150, and along the diodes 120 and 140. Insulative material 130 may comprise any suitable composition, or combination of compositions, and in some embodiments may comprise one or both of silicon dioxide and silicon nitride.

The phase change materials 108 and 114 are examples of thermally sensitive memory element materials that may be utilized in the memory cells 104 and 106. Other thermally sensitive memory element materials may be utilized in other embodiments, with such other memory element materials including, for example, electrically resistive materials.

As discussed above, the effects of 5.8 gigahertz microwave radiation are cumulative so that a doped region may be activated with several sequential pulses of microwave radiation and/or an amorphous region crystallized with several sequential pulses of microwave radiation. Yet, the effects of exposure to 5.8 gigahertz microwave radiation are also self-limiting so that excessive exposure to the 5.8 gigahertz microwave radiation will not create adverse effects. These properties of 5.8 gigahertz microwave radiation may be taken advantage of during fabrication of multiple levels of integrated circuitry over a semiconductor substrate, such as, for example, during fabrication of three-dimensional stacked memory.

Figure 13:
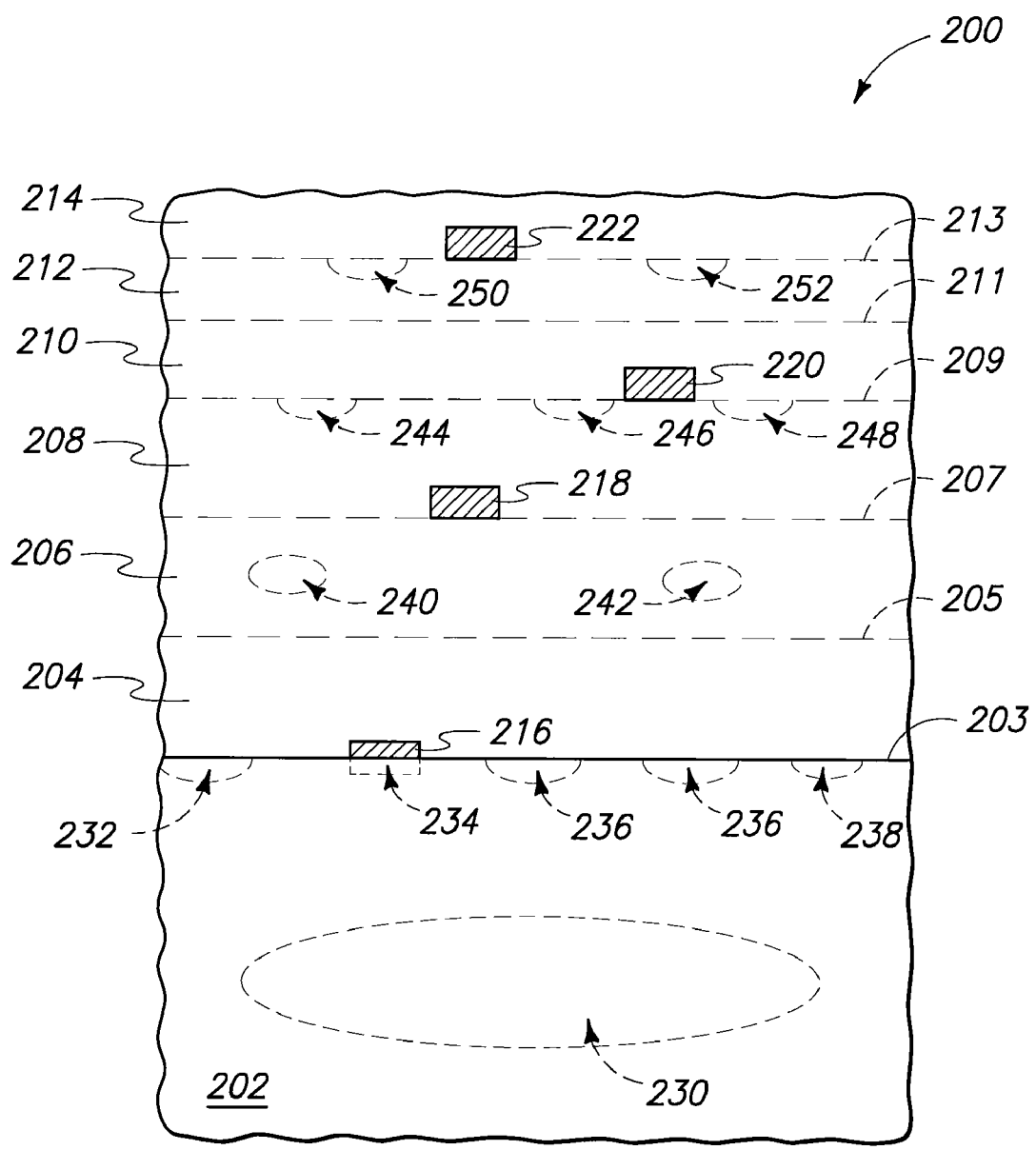
FIG. 13 is a diagrammatic, cross-sectional view of a portion of a semiconductor construction at a process stage of an example embodiment.

FIG. 13 shows a semiconductor construction 200 comprising a semiconductor substrate 202, and a plurality of integrated circuit levels 204, 206, 208, 210, 212, and 214 formed over the semiconductor substrate. Each level may comprise numerous semiconductor components (for instance, volatile cells, non-volatile cells, wiring, capacitors, etc.). The components may comprise electrically conductive materials. Example electrically conductive materials are diagrammatically illustrated as materials 216, 218, 220 and 222.

Boundaries between the various levels of integrated circuitry are diagrammatically illustrated with dashed lines 205, 207, 209, 211, and 213; and an upper surface of the substrate is diagrammatically illustrated with a solid line 203.

Numerous doped regions are formed at various levels within construction 200, with example doped regions being diagrammatically illustrated as regions 230, 232, 234, 236, 238, 240, 242, 244, 246, 248, 250 and 252. The doped regions may be utilized for numerous purposes. For instance, the large doped region 230 within substrate 202 may be a gettering region, whereas others of the doped regions may ultimately be utilized as a source/drain regions, portions of diodes, portions of conductive wiring, etc.

Several of the various doped regions will be formed at different processing stages relative to one other, with the doped regions in the lower levels generally being formed before the doped regions at the higher levels.

In some embodiments, a doped region at a lower level (for instance, one of the regions 230, 232, 234, 236 and 238) may be referred to as a first doped region, and a doped region at a higher level (for instance, one of the regions 250 and 252) may be referred to as a second doped region. A first pulse of microwave radiation having a frequency of about 5.8 gigahertz may be utilized to activate the dopant within the first doped region. In some embodiments, the first pulse may be conducted for a duration suitable to activate some, but not all of the dopant within the first doped region. Subsequently, the second doped region may be formed, and then a second pulse of microwave radiation having the frequency of about 5.8 gigahertz may be utilized to complete activation of the dopant within the first doped region while also activating all of the dopant within the second doped region.

Construction 200 may comprise one or more materials that are thermally sensitive, and specifically which are adversely affected by temperatures in excess of 500° C. Such materials may include, for example, phase change materials and/or metal silicides. One or more of the pulses of microwave radiation may be utilized after such materials have been incorporated into construction 200, since the 5.8 gigahertz microwave radiation can be used without heating the semiconductor construction to a temperature exceeding 500° C. In some embodiments, the thermally sensitive materials may be adversely affected by temperatures in excess of 400° C., or even in excess of 350° C., and the treatment with the microwave radiation having a frequency of 5.8 gigahertz may be utilized without adversely impacting such materials.

Although many of the embodiments discussed above indicate that microwave radiation having a frequency of 5.8 gigahertz may be utilized to simultaneously activate dopant and increase crystallization within a semiconductor substrate, there may be embodiments in which it is desired to activate dopant without substantially increasing crystallization or vice versa. In such embodiments, the duration of the pulse of microwave radiation may be adjusted in an attempt to accomplish primarily one or the other of dopant activation and crystallization.

Although the example embodiments of FIGS. 1-13 are directed toward fabrication of integrated circuitry, the utilization of 5.8 gigahertz microwave radiation may be applied to other semiconductor fabrication processes in other embodiments, including, for example, fabrication of MEMS.

The structures formed by the methods of FIGS. 1-13 may be incorporated into various electronic systems. FIGS. 14-17 illustrate example electronic systems that may utilize one or more of such structures.

Figure 14:
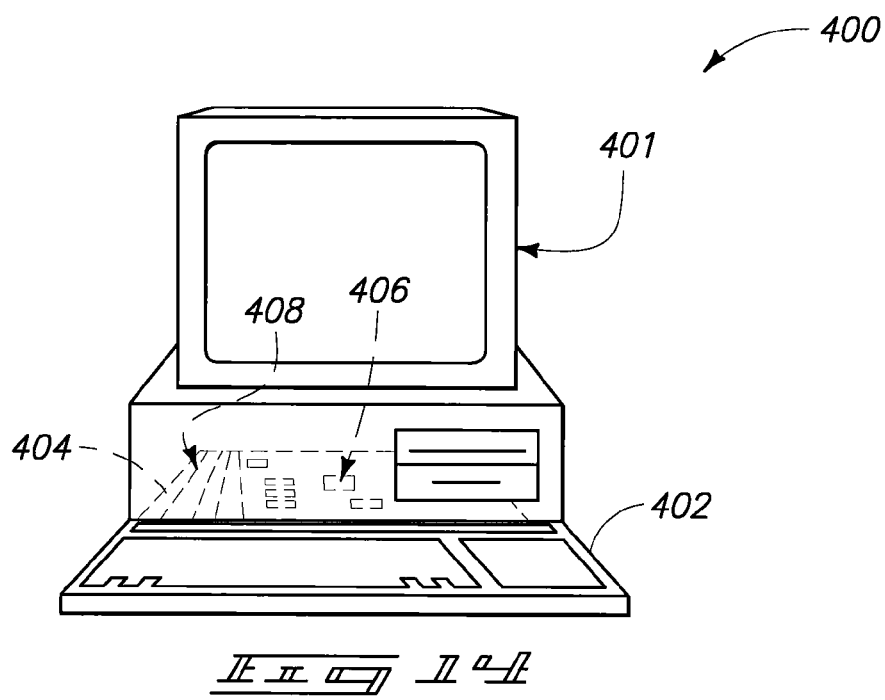
FIG. 14 is a diagrammatic view of a computer embodiment.
Figure 15:
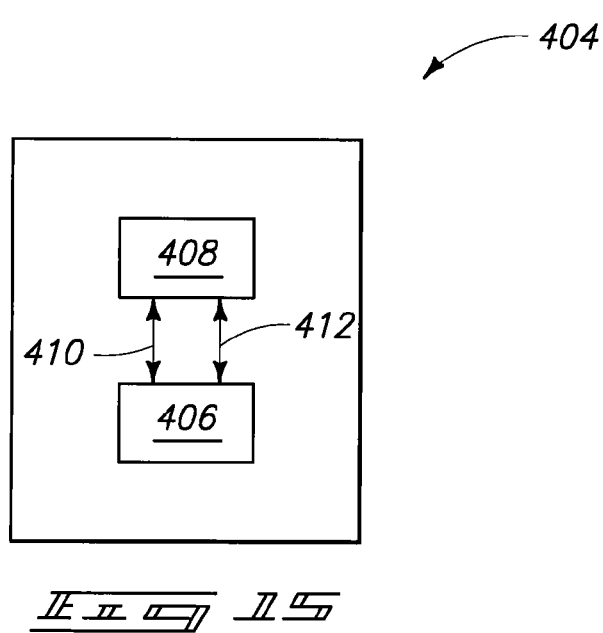
FIG. 15 is a block diagram showing particular features of the motherboard of the FIG. 14 computer embodiment.

FIG. 14 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 15. In such block diagram, the addressing circuitry is illustrated as 410 and the read circuitry is illustrated as 412.

Processor device 406 may correspond to a processor module, and associated memory utilized with the module may comprise one or more structures formed by the methods of FIGS. 1-13.

Memory device 408 may correspond to a memory module, and may comprise one or more structures formed by the methods of FIGS. 1-13.

Figure 16:
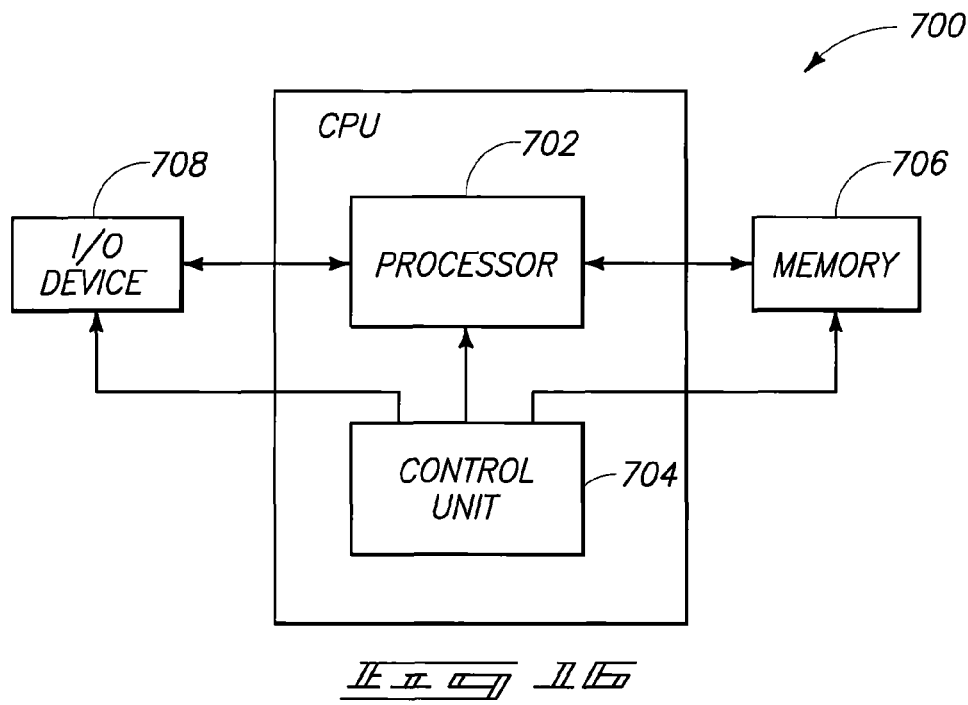
FIG. 16 is a high level block diagram of an electronic system embodiment.

FIG. 16 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include one or more structures formed by the methods of FIGS. 1-13.

Figure 17:
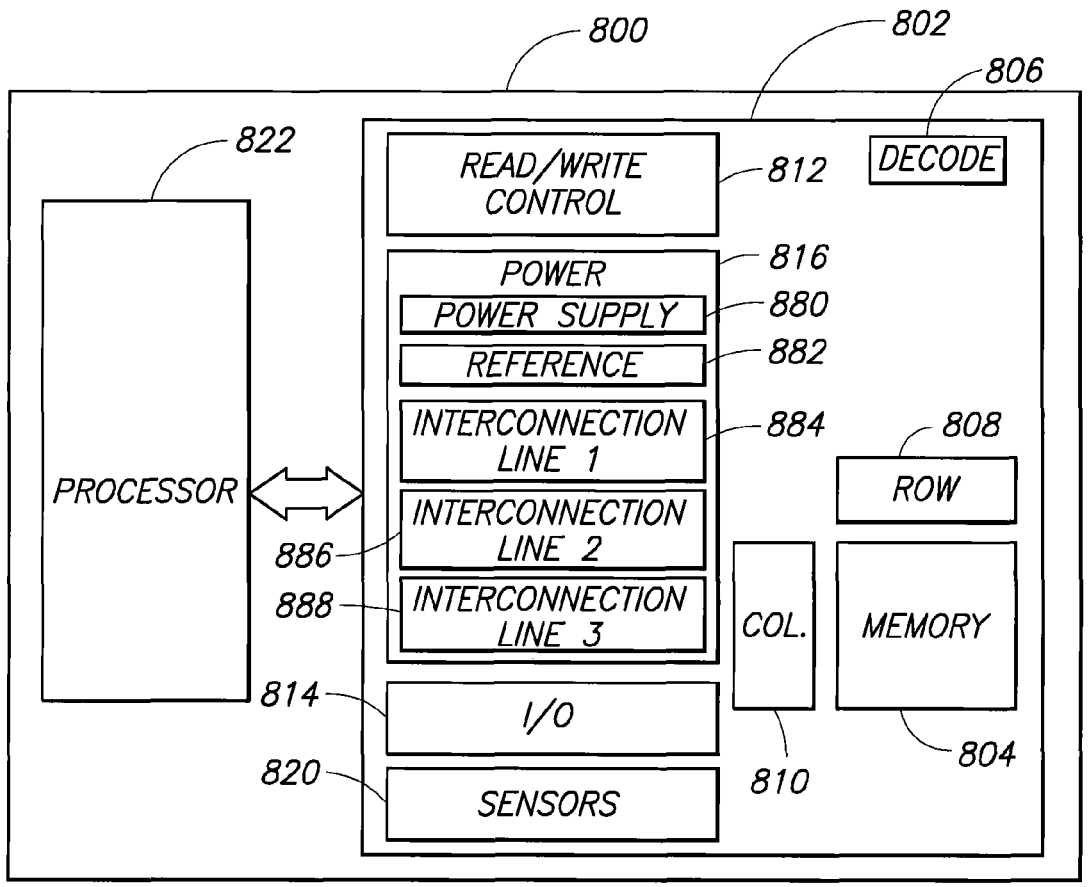
FIG. 17 is a simplified block diagram of a memory device embodiment.

FIG. 17 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, an interconnection line 884 for providing a first wordline with pulses, an interconnection line 886 for providing a second wordline with pulses, and an interconnection line 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 and memory device 802 may include one or more structures formed by the methods of FIGS. 1-13.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor construction, comprising:
    implanting dopant within silicon; the silicon being monocrystalline, and the implanting forming damage regions of amorphous silicon; and
    simultaneously activating the dopant and repairing the damage regions by exposing the silicon to microwave radiation having a main spectrum wavelength peak at about 5.2 centimeters, a temperature of the silicon not exceeding about 500° C. during the exposure to the microwave radiation.

2. The method of claim 1 wherein the temperature does not exceed about 350° C.

3. The method of claim 1 wherein the dopant comprises one or more of boron, phosphorus and arsenic.

4. The method of claim 1 wherein:
    the implanting is a first implanting and comprises implanting of a first dopant having a first conductivity type;
    a second implanting is conducted after the first implanting, and the second implanting comprises implanting of a second dopant having a second conductivity type that is opposite to the first conductivity type; and
    the activation of the dopant and the repair of the damage regions occurs after the first and second implantings.

5. The method of claim 4 wherein the first and second implantings form a p-type region of the silicon directly against an n-type region of the silicon, and wherein the p-type region and the n-type region are together comprised by a p-n diode.

6. The method of claim 1 further comprising forming a transistor gate over the silicon prior to implanting the dopant, and wherein the implanting forms conductively-doped source/drain regions aligned with the gate.

7. The method of claim 6 further comprising forming metal silicide over and directly against the conductively-doped source/drain regions prior to the activation of the dopant.

8. A method of forming integrated circuitry, comprising:
    providing first dopant within a semiconductor construction comprising silicon-containing material;

utilizing a first pulse of microwave radiation having a frequency of about 5.8 gigahertz for a duration suitable to activate only some of the first dopant, while a temperature of the silicon-containing material remains at less than or equal to about 500° C.;

after utilizing the first pulse of microwave radiation; providing second dopant within the semiconductor construction; and utilizing a second pulse of microwave radiation having a frequency of about 5.8 gigahertz for a duration suitable to complete activation of the first dopant and to fully activate the second dopant, while a temperature of the silicon-containing material remains at less than or equal to about 500° C.

9. The method of claim 8 wherein:
the temperature during the first pulse of microwave radiation remains at less than or equal to about 400° C.; and
the temperature during the second pulse of microwave radiation remains at less than or equal to about 400° C.

10. The method of claim 8 wherein:
the temperature during the first pulse of microwave radiation remains at less than or equal to about 350° C.; and
the temperature during the second pulse of microwave radiation remains at less than or equal to about 350° C.

11. The method of claim 8 wherein:
the semiconductor construction comprises a monocrystalline silicon wafer;
the first dopant forms a well within the monocrystalline silicon wafer doped to a first dopant type; and
the second dopant forms an implant region that is entirely contained within said well, and which is doped to a second dopant type that is opposite to the first dopant type.

12. The method of claim 8 wherein:
the semiconductor construction is formed to comprise multiple levels of integration that are stacked over one another;
the first dopant is provided at one of the levels of integration; and
the second dopant is provided at a different level of integration than the first dopant.

13. The method of claim 8 wherein:
the semiconductor construction is formed to include one or more materials that are adversely affected by temperatures in excess of 500° C.; and
the second pulse of radiation is utilized after at least one of said one or more materials is incorporated into the semiconductor construction.

14. The method of claim 8 wherein:
the semiconductor construction is formed to include phase change material; and
the second pulse of radiation is utilized after the phase change material is incorporated into the semiconductor construction.

15. The method of claim 8 wherein:
the semiconductor construction is formed to include metal silicide; and
the second pulse of radiation is utilized after the metal silicide is incorporated into the semiconductor construction.

16. A method of forming integrated circuitry, comprising the following steps in the listed order:
providing dopant within a silicon-containing material;
utilizing a first pulse of microwave radiation having a frequency of about 5.8 gigahertz for a duration suitable to activate only some of the dopant, while a temperature of the silicon-containing material remains at less than or equal to about 500° C.;
forming one or more additional materials over the silicon-containing material; and
utilizing a second pulse of microwave radiation having a frequency of about 5.8 gigahertz for a duration suitable to complete activation of the dopant, while a temperature of the silicon-containing material remains at less than or equal to about 500° C.

17. The method of claim 16 wherein:
the temperature during the first pulse of microwave radiation remains at less than or equal to about 400° C.; and
the temperature during the second pulse of microwave radiation remains at less than or equal to about 400° C.

18. The method of claim 16 wherein:
the temperature during the first pulse of microwave radiation remains at less than or equal to about 350° C.; and
the temperature during the second pulse of microwave radiation remains at less than or equal to about 350° C.

19. The method of claim 16 wherein the silicon-containing material consists of silicon.

20. The method of claim 16 further comprising incorporating the dopant into a volatile memory cell.

21. The method of claim 16 further comprising incorporating the dopant into a non-volatile memory cell.

22. The method of claim 16 further comprising incorporating the dopant into a diode.

23. A method of forming a semiconductor construction, comprising:
forming a memory element material over a semiconductor substrate;
forming semiconductor material proximate the memory element material;
doping a first region of the semiconductor material with p-type dopant;
doping a second region of the semiconductor material with n-type dopant; and
after forming the memory element material, utilizing microwave radiation having a frequency of about 5.8 gigahertz to activate the p-type and n-type dopants, the activation occurring while the memory element material and the semiconductor material remain at a temperature of less than or equal to about 500° C.

24. The method of claim 23 wherein the memory element material consists of phase change material.

25. The method of claim 24 wherein the phase change material comprises germanium, antimony and tellurium.

26. The method of claim 23 wherein the temperature is less than or equal to about 350° C.

27. The method of claim 23 wherein the semiconductor material consists of silicon.

28. The method of claim 23 wherein the semiconductor material consists of silicon; and wherein the p-type and n-type dopants are selected from the group consisting of boron, phosphorus and arsenic.

* * * * *